(12) United States Patent
Byun

(10) Patent No.: US 11,594,565 B2
(45) Date of Patent: Feb. 28, 2023

(54) IMAGE SENSOR

(71) Applicant: SK hynix Inc., Icheon-si (KR)

(72) Inventor: Kyung Su Byun, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 183 days.

(21) Appl. No.: 16/991,795

(22) Filed: Aug. 12, 2020

(65) Prior Publication Data

US 2021/0249460 A1     Aug. 12, 2021

(30) Foreign Application Priority Data

Feb. 6, 2020   (KR) .................. 10-2020-0014362

(51) Int. Cl.
*H01L 27/146*     (2006.01)

(52) U.S. Cl.
CPC .... *H01L 27/14629* (2013.01); *H01L 27/1464* (2013.01); *H01L 27/14649* (2013.01); *H01L 27/1463* (2013.01); *H01L 27/14627* (2013.01)

(58) Field of Classification Search
CPC .......... H01L 27/14629; H01L 27/1464; H01L 27/14636
See application file for complete search history.

(56) References Cited

U.S. PATENT DOCUMENTS

| 7,755,123 | B2 | 7/2010 | Dungan et al. |
| 8,716,823 | B2 | 5/2014 | Lenchenkov |
| 9,093,345 | B2 | 7/2015 | Kato et al. |
| 2007/0001100 | A1* | 1/2007 | Hsu ................. H01L 27/14625 257/E31.119 |
| 2012/0147208 | A1* | 6/2012 | Otsuka ............. H01L 27/14629 257/E31.127 |

FOREIGN PATENT DOCUMENTS

KR   10-1559907 B   10/2015

* cited by examiner

*Primary Examiner* — Tucker J Wright
(74) *Attorney, Agent, or Firm* — Perkins Coie LLP

(57) ABSTRACT

An image sensor is disclosed. In some implementations, the image sensor includes a substrate including one or more photoelectric conversion elements arranged in the substrate and structured to convert light into electrical signals representing an image carried by the light, and a plurality of metal layers arranged at different distances from a surface of the substrate and located below the one or more photoelectric conversion elements, each of the metal layers including one or more metal patterns. The one or more metal patterns of the plurality of metal layers are arranged in a concave shape facing the photoelectric conversion element such that incident light reflected by metal layers converges toward the photoelectric conversion element.

17 Claims, 6 Drawing Sheets

IMAGE SENSOR

CROSS-REFERENCE TO RELATED APPLICATION

This patent document claims the priority and benefits of Korean patent application No. 10-2020-0014362, filed on Feb. 6, 2020, the disclosure of which is incorporated herein by reference in its entirety as part of the disclosure of this patent document.

TECHNICAL FIELD

The technology and implementations disclosed in this patent document generally relate to an image sensor for generating an electrical signal in response to infrared (IR) light.

BACKGROUND

An image sensor is a device for capturing optical images by converting light into electrical signals using a photosensitive semiconductor material that reacts to light. With the recent development of automotive, medical, computer, and communication industries, the demand for high-performance image sensors is increasing in various devices such as smartphones, digital cameras, game consoles, Internet of Things (IoT), robots, surveillance cameras, medical microcameras, etc.

Image sensors may be broadly classified into CCD (charge coupled device)-based image sensors and CMOS (complementary metal oxide semiconductor)-based image sensor. The CCD image sensors offer the best available image quality, but they tend to consume more power and are larger as compared to CMOS image sensors. The CMOS image sensors are smaller in size and consume less power than the CCD image sensors. The CMOS image sensors may be implemented using many different scanning schemes, and because CMOS sensors are fabricated using the CMOS fabrication technology, the CMOS image sensors and other signal processing circuitry can be integrated into a single chip, enabling the production of small-sized image sensors at a lower cost. For these reasons, the CMOS image sensors are being intensively researched and rapidly coming into widespread use.

SUMMARY

This patent document provides, among others, fabrication methods of image sensors that can improve the sensitivity to infrared wavelengths using one or more metal patterns for reflecting light at infrared wavelengths toward photoelectric conversion elements.

In an embodiment of the disclosed technology, an image sensor includes a substrate including one or more photoelectric conversion elements arranged in the substrate and structured to convert light into electrical signals representing an image carried by the light, and a plurality of metal layers arranged at different distances from a surface of the substrate and located below the one or more photoelectric conversion elements, each of the metal layers including one or more metal patterns. Here, the one or more metal patterns of the plurality of metal layers are arranged in a concave shape facing the photoelectric conversion element such that incident light reflected by metal layers converges toward the photoelectric conversion element.

In another embodiment of the disclosed technology, an image sensor includes a photoelectric conversion element arranged in a substrate, and two or more metal layers arranged at different distances from the photoelectric conversion element. Here, a distance between metal patterns contained in a first metal layer is larger than a distance between metal patterns contained in a second metal layer located further away from the photoelectric conversion element than the first metal layer, and the image sensor is structured to receive incident light to reach the photoelectric conversion element first and then to reach to the two or more metal layers.

In another embodiment of the disclosed technology, an image sensor includes a substrate, one or more photoelectric conversion elements arranged in the substrate, and one or more optically reflective elements arranged below the one or more photoelectric conversion elements to reflect light that reaches the one or more optically reflective elements through the one or more photoelectric conversion elements toward the one or more photoelectric conversion elements.

In another embodiment of the disclosed technology, an image sensor may include a substrate having a photoelectric conversion element, and a plurality of metal layers sequentially stacked in a lower portion of the substrate. Each of the metal layers may include one or more metal patterns. In this case, the metal patterns contained in the plurality of metal layers may be formed in a concave shape that is concave toward the photoelectric conversion element.

In another embodiment of the disclosed technology, an image sensor may include a substrate including a photoelectric conversion element, and first to n-th metal layers (where 'n' is an integer of 2 or more) sequentially stacked in a lower portion of the substrate. In this case, a distance between metal patterns contained in a k-th metal layer (where 'k' is an integer selected from '1' to 'n') may be larger than a distance between metal patterns contained in an l-th metal layer (where 'l' is an integer greater than 'k').

It is to be understood that the foregoing general description, the accompanying drawings, and the following detailed description in this patent document are illustrative and explanatory of technical features and implementations of the disclosed technology.

DETAILED DESCRIPTION

Figure 1:
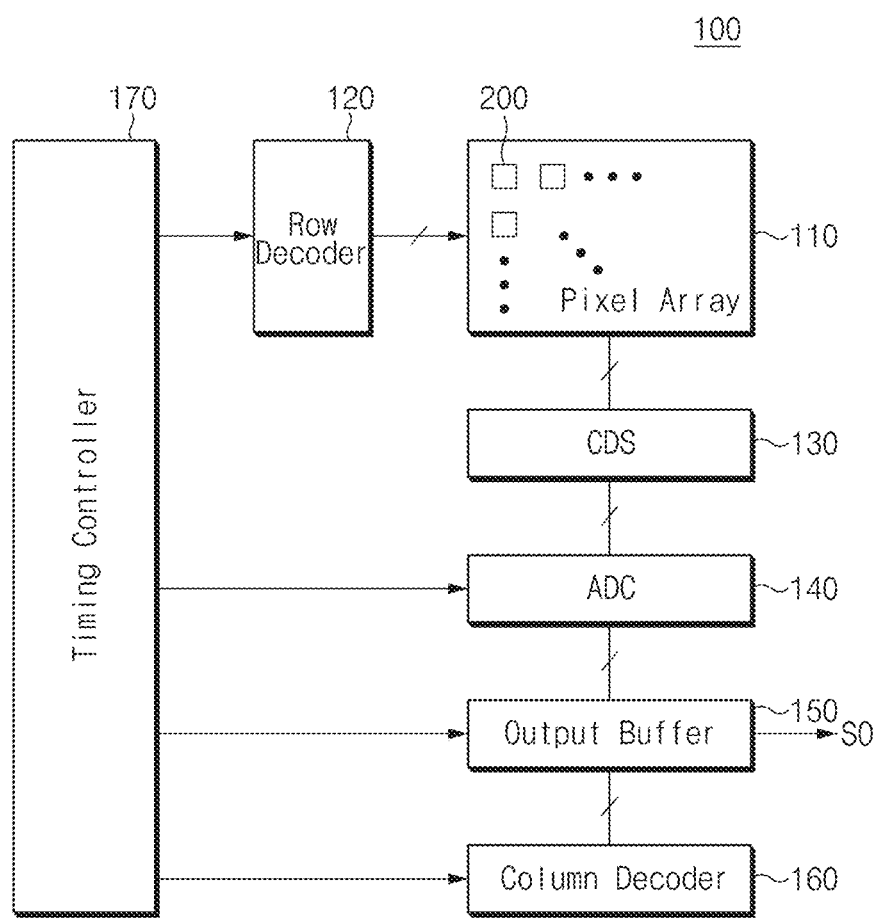
FIG. 1 is a block diagram illustrating an example of an image sensor based on some implementations of the disclosed technology.

This patent document provides implementations and examples of an image sensor that can improve the sensitivity to infrared wavelengths using one or more metal patterns for reflecting light at infrared wavelengths toward photoelectric conversion elements. The disclosed technology can be used in some embodiments to implement an image sensor that includes a reflection structure structured to reflect infrared (IR) light having penetrated photoelectric conversion elements toward the photoelectric conversion elements, thereby improving the light absorption rate at infrared wavelengths.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments. In the drawings, the sizes and shapes of elements may be exaggerated for convenience and clarity of description.

FIG. 1 is a block diagram illustrating an example of an image sensor 100 based on some implementations of the disclosed technology.

In some implementations, the image sensor 100 acting as a complementary metal oxide semiconductor (CMOS) image sensor may include a pixel array 110, a row decoder 120, a correlated double sampler (CDS) circuit 130, an analog-to-digital converter (ADC) 140, an output buffer 150, a column decoder 160, and a timing controller 170. In this case, the above-mentioned constituent elements of the image sensor 100 are merely examples, and at least some constituent elements from among the constituent elements may be added to or omitted from the image sensor 100 as necessary.

The pixel array 110 may include a plurality of unit pixels arranged in rows and columns in a two-dimensional (2D) array. The plurality of unit pixels can be structured to convert an optical signal or incident light into an electrical signal respectively or on the basis of shared pixels in an implementation where at least two unit pixels share at least one element of the circuitry involved in photoelectric conversion. Although each unit pixel or each shared pixel may correspond to a 3T pixel (3 transistors per pixel), a 4T pixel (4 transistors per pixel), or a 5T pixel (5 transistors per pixel), or may include more than 5 transistors per cell. The pixel array 110 may receive a control signal such as a row selection signal, a pixel reset signal, and a transmission (Tx) signal from the row decoder 120, and may be operated based on the control signal received from the row decoder 120.

In some implementations, in response to light at infrared (or near infrared NIR) wavelengths (e.g., 800 nm-1000 nm), the unit pixel 200 may generate an electrical signal corresponding to the intensity of the light.

In some implementations, the electrical signal generated by the unit pixel 200 may be used to generate a depth image, which may be used to measure a distance to a target object using a time of flight (TOF) method. That is, after a modulated light signal at a predetermined wavelength has been sent to the target object from a light source (not shown) spaced apart from the image sensor by a predetermined distance, the image sensor 100 may detect the modulated light (incident light) reflected from the target object and the TOF method can calculate depth information such as the distance between the target object and the image sensor for each pixel using the detected modulated light (incident light). Each of the modulated light and the incident light may be light at wavelengths within an infrared (IR) wavelength band. In some implementations, the TOF method may measure the round trip time of the light signal, which is reflected from the target object and returns to the image sensor, to calculate the distance between the target object and the image sensor. The round trip time of the light signal or a time delay caused by the distance between the image sensor 100 and the target object may be measured based on the modulated light and the incident light. Such a time delay may be expressed as a phase difference between signals generated by the image sensor 100. An image processor (not shown) may calculate such a phase difference between output signals of the image sensor 100 to generate a depth image including depth information for each pixel using the calculated phase difference.

In one example, the light source (not shown), the image processor (not shown), and the image sensor 100 can be incorporated into a single module. In another example, the light source, the image processor, and the image sensor 100 may be implemented in separate devices.

In some embodiments of the disclosed technology, the electrical signal generated by the unit pixel 200 may be used to acquire images in a dark environment, improving visibility of objects in a dark environment by detecting infrared light instead of visible light. In some embodiments of the disclosed technology, the electrical signal generated by the unit pixel 200 may be used to correct visible light images.

In one embodiment, all the unit pixels arranged in the pixel array may be structured to detect infrared light. In another embodiment, the pixel array may include different types of unit pixels, such as unit pixels 200 for sensing infrared light and unit pixels for detecting light in a different wavelength range (e.g., unit pixels for sensing visible light).

The row decoder 120 may activate the pixel array 110 based on control signals and/or clock signals from the timing controller 170. In some implementations, in selecting rows from the pixel array 110, the row decoder 120 may generate a row selection signal to select at least one of a plurality of rows. The row decoder 120 may sequentially enable a pixel reset signal for resetting pixels corresponding to at least one selected row, and a transmission (Tx) signal for the selected pixels to transmit electrical signals generated by the pixels. In this way, an analog-type reference signal and an image signal that are generated from each pixel of the selected row may be sequentially transmitted to the CDS circuit 130. In this regard, the reference signal and the image signal may be collectively called a pixel signal as necessary.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS circuit 130 may sequentially sample and hold the reference signal and the image signal that are transferred from the pixel array 110 to each of the plurality of column lines. That is, the CDS circuit 130 may sample and hold voltage levels of the reference signal and the image signal corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC 140 is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may receive the CDS signal for each column from the CDS circuit 130, may convert the received CDS signal into a digital signal, and may thus output the digital signal. In some implementations, the ADC 140 samples an input signal (e.g., pixel signal) multiple times using the reference signal and analog-to-digital convert the sampled input signals by counting the number of clock pulses until crossing points. The ADC 140 may perform counting and calculation operations based on the CDS signal for each column and a ramp signal received from the timing controller 170, such that the ADC 140 may generate digital image data from which noise (e.g., unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In another embodiment, the ADC 140 may include a single global counter, and may convert a CDS signal corresponding to each column into a digital signal using a global code received from the global counter.

The output buffer 150 may receive image data for each column received from the ADC 140. In addition, the output buffer 150 may capture the received image data, and may output the captured image data. The output buffer 150 may temporarily store image data that is output from the ADC 140 upon receiving a control signal from the timing controller 170. The output buffer 150 may operate as an interface configured to compensate for data rate difference or transmission (Tx) speed difference between the image sensor 100 and another device coupled to the image sensor 100.

The column decoder 160 may select a column of the output buffer 150 upon receiving a control signal from the timing controller 170, and may sequentially output the temporarily stored image data to the output buffer 150. In some implementations, the column decoder 160 may receive an address signal from the timing controller 170, may generate a column selection signal based on the received address signal, and may select a column of the output buffer 150 to output image data as an output signal S0 from the selected column of the output buffer 150.

The timing controller 170 may control the row decoder 120, the ADC 140, the output buffer 150, and the column decoder 160.

The timing controller 170 may transmit a clock signal for operating or synchronizing the constituent elements of the image sensor 100, a control signal for timing control, and address signals needed for selection of a row or column to the row decoder 120, the column decoder 160, the ADC 140, and the output buffer 150. In some implementations, the timing controller 170 may include, for example, a logic control circuit, a phase locked loop (PLL) circuit, a timing control circuit, and a communication interface circuit.

Figure 2:
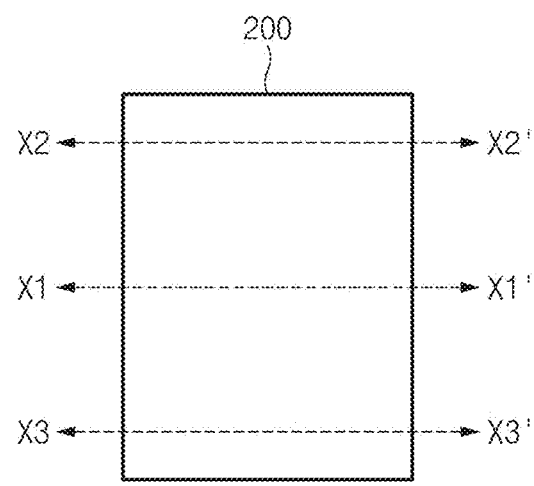
FIG. 2 is a schematic diagram illustrating an example of a unit pixel shown in FIG. 1.

FIG. 2 is a schematic diagram illustrating an example of the unit pixel 200 shown in FIG. 1.

In some implementations, the unit pixel 200 may refer to a unit pixel contained in the pixel array 110 shown in FIG. 1. The unit pixel 200 may be an image sensor pixel that receives infrared light and generates an electrical signal corresponding to the infrared light. By way of example only, one unit pixel 200 is illustrated in FIG. 2, and it should be noted that other unit pixels can have the same structure and functions.

As will be discussed below, FIGS. 3-6 illustrate the cross-sectional views of the unit pixel 200 taken along at least one of first to third cutting lines X1-X1', X2-X2', and X3-X3'. The first cutting line X1-X1' may be used to illustrate a vertical cross-sectional view cutting the center region of the unit pixel 200. Each of the second cutting line X2-X2' and the third cutting line X3-X3' may be used to illustrate a vertical cross-sectional view cutting the edge region of the unit pixel 200.

CMOS image sensors are formed on substrates and contain metal patterns (including conductive metal lines) for photosensing pixels (having photoelectric conversion elements) and sensory circuitry for both operating photosensing pixels and for pixel readout. Such metal patterns may reflect or scatter incident light received by a CMOS image sensor and such reflected or scattered light, if not managed, may adversely affect the sensing performance or operation. For example, in CMOS image sensors in the back side illumination (BSI) configuration, a lens array for receiving incident light to the CMOS image sensor and the metal patterns are formed on opposite sides of the photosensing pixel layer. Incident light to such BSI image sensor first passes through the lens array to reach the photosensing pixels in the photosensing pixel layer and then encounters metal patterns on the other side of the photosensing pixel layer. Such metal patterns are generally optically reflective and the reflected light may be directed to other directions without passing through the photosensing pixels. Therefore, such of the incident light so reflected by the metal patterns may not be received by the photosensing pixels and this can adversely impact the optical detection efficiency of the image sensor. As explained in detail below, such metal patterns may be structured to have a concave surface facing the photosensing pixels with photoelectric conversion elements so that reflected light by the metal patterns can be converged towards the photosensing pixels with photoelectric conversion elements to improve the optical detection efficiency, especially for infrared (IR) light with a large penetration depth into the silicon.

Figure 3:
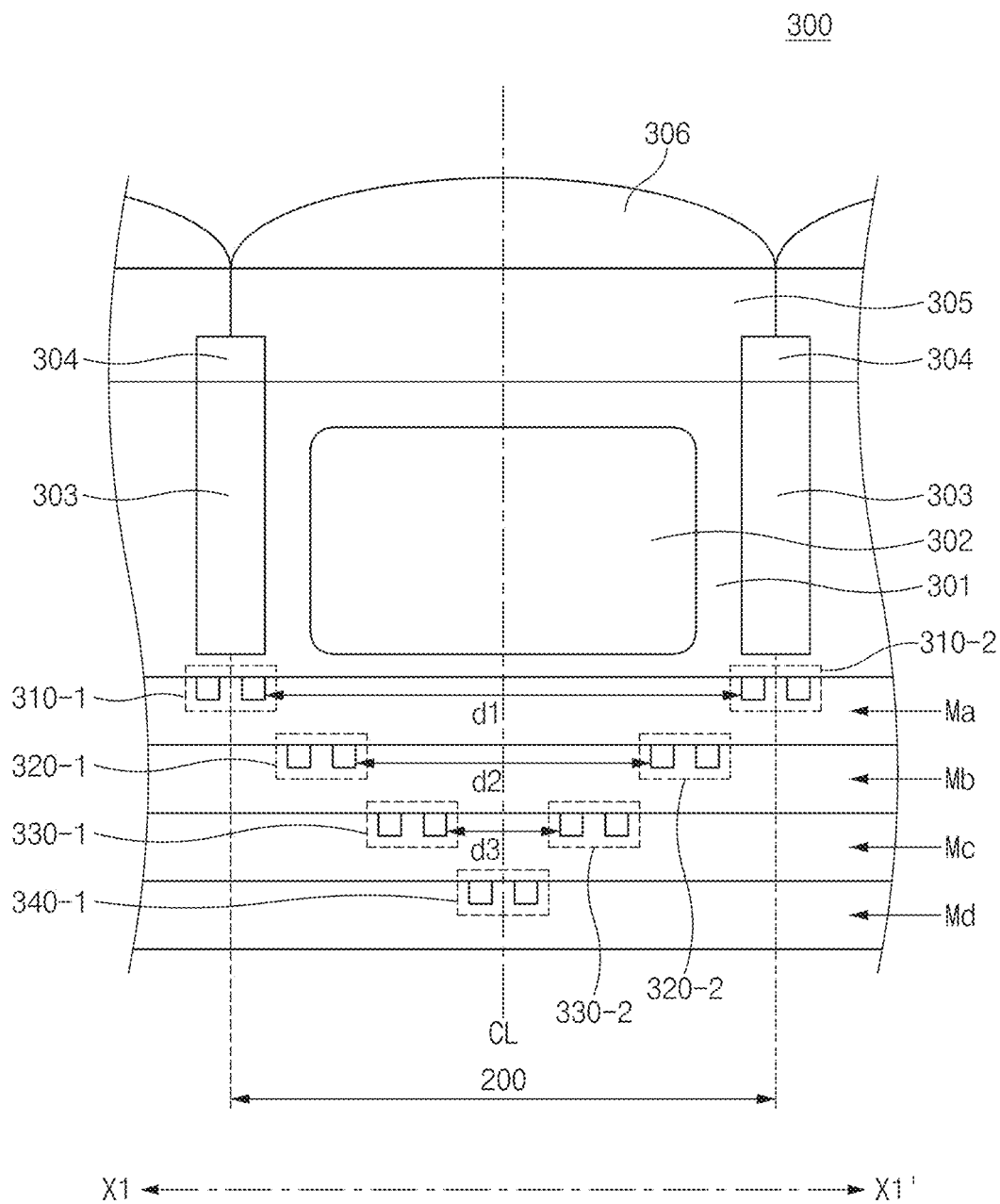
FIG. 3 is a cross-sectional view illustrating an example of the unit pixel shown in FIG. 2.

FIG. 3 is a cross-sectional view illustrating an example of the unit pixel 200 shown in FIG. 2 for a BSI CMOS image sensor.

In some implementations, the cross-sectional view 300 of the unit pixel 200 may be a cross-sectional view illustrating the unit pixel taken along the first cutting line X1-X1' shown in FIG. 2.

The cross-sectional view 300 of the unit pixel 200 may include a substrate 301, a photoelectric conversion element 302, at least one device isolation film 303, at least one grid region 304, an optical filter 305, a microlens 306, and first to fourth metal layers (Ma-Md).

The substrate 301 may include a top surface and a bottom surface facing each other. For example, the substrate 301 may be a P-type or N-type bulk substrate, may be a P-type bulk substrate in which a P-type or N-type epitaxial layer is grown, or may be an N-type bulk substrate in which a P-type or N-type epitaxial layer is grown.

The photoelectric conversion element 302 may be disposed in a region corresponding to the unit pixel 200 in the substrate 301. The photoelectric conversion element 302 may generate and accumulate photocharges corresponding to the intensity of incident light in an inner region thereof. The photoelectric conversion element 302 may be arranged across as large a region as possible to increase a fill factor indicating light reception (Rx) efficiency. For example, the photoelectric conversion element 302 may also be implemented as a photodiode, a phototransistor, a photogate, a pinned photodiode or a combination thereof.

If the photoelectric conversion element 302 is implemented as a photodiode, the photoelectric conversion element 302 may be formed as an N-type doped region through ion implantation of N-type ions. In one embodiment, the photodiode may be formed by stacking a plurality of doped regions on top of one another. In this case, a lower doped region may be formed by implantation of P-type ions or $N^+$ ions, and an upper doped region may be formed by implantation of $N^-$ ions.

In order to form the device isolation film 303, a deep trench isolation (DTI) structure may be formed by etching a substrate or a material layer in the substrate in a vertical direction through a trench process at both sides of the photoelectric conversion element 302 and by filling the etched region with an insulation material having a refractive index (i.e., high-reflectivity insulation material) different from that of the substrate 301. By way of example only, the device isolation film 303 may be formed of at least one selected from among a silicon oxide film, a silicon nitride film, and a silicon oxynitride film. The device isolation film 303 may be structured to reduce or minimize the optical crosstalk that occurs when light incident upon the unit pixel 200 undesirably propagates toward another contiguous pixel, worsening the signal-to-noise ratio (SNR).

The grid region 304 may be disposed between the color filters 305 adjacent to each other to prevent optical crosstalk between the contiguous color filters 270. In some implementations, the grid region 304 may be formed of a metal material that tends to absorb light rather than reflect it. In some implementations, the grid region 304 may be formed by stacking tungsten (W) and titanium nitride (TiN).

The optical filter 305 may be formed over the substrate 301 to filter the light at a specific wavelength (e.g., red light, green light, blue light, etc.) to be detected by the photoelectric conversion elements by transmitting light at a certain wavelength while blocking light at other wavelengths. The optical filter 305 contained in the unit pixel 200 may be an infrared (IR) filter configured to absorb infrared light. In some implementations, an anti-reflection layer (not shown) may be formed below the optical filter 305.

The microlens 306 may be formed over the optical filter 305 to converge incident light to a corresponding color filter, thereby improving the light reception (Rx) efficiency. An over-coating layer (not shown) may be formed above or below the microlens 306 to prevent the irregular or diffused reflection of incident light, thereby suppressing flare characteristics.

Each of the first to fourth metal layers (Ma-Md) may include metal lines. In this case, the metal lines may transmit control signals (e.g., a row selection signal, a pixel reset signal, a transmission (Tx) signal, etc.) to operate the unit pixel 200, or may output pixel signals (e.g., a reference signal, an image signal, etc.) generated by the unit pixel 200 to the outside.

The first to fourth metal layers (Ma-Md) may be arranged at different depths from a surface of the substrate 301. In some implementations, first to fourth metal layers (Ma-Md) may be formed by sequentially stacking a plurality of layers including the metal layers on top of one another. For example, the first to fourth metal layers (Ma-Md) may respectively refer to a metal layer M0, a metal layer M1, a metal layer M2, and a metal layer M3, or may respectively refer to a metal layer M1, a metal layer M2, a metal layer M3, and a metal layer M4. Although FIG. 3 illustrates the first to fourth metal layers (Ma-Md) corresponding to four metal layers by way of example only, a reflection structure based on some embodiments of the disclosed technology may include less or more than four metal layers (e.g., three or five metal layers). In addition, the first to fourth metal layers (Ma-Md) may not serve as continuous metal layers, and at least two contiguous metal layers from among the first to fourth metal layers (Ma-Md) may serve as discontinuous metal layers. For example, the first to third metal layers (Ma-Mc) may be metal layers (M0-M2), and the fourth metal layer (Md) may be a metal layer M4.

Each of the first to fourth metal layers (Ma-Md) may include at least one metal line (e.g., 310-1 and 310-2) and an insulation layer that surrounds the at least one metal line to insulate the at least one metal line. Therefore, metal lines contained in the contiguous metal layers (e.g., Ma and Mb) may be electrically isolated from each other.

Metal patterns 310-1 and 310-2 of the first metal layer (Ma) may be disposed at both ends of the unit pixel 200 in a manner that the metal pattern 310-1 may be spaced apart from the other metal pattern 310-2 by a first distance (d1). By way of example only, each of the metal patterns 310-1 and 310-2 is disposed below the device isolation film 303 as shown in FIG. 3. As will be discussed below, the metal patterns 310-1 and 310-2 and other metal patterns may include two metal lines that are horizontally close to each other, and the number and shape of metal lines contained in the metal patterns may vary depending on the structures of other patterns and layers. In some implementations, the metal pattern may be formed of a set of separate metal lines that are closely situated to each other at intervals of a predetermined distance (e.g., 1000 nm or less). In other implementations, instead of the metal lines that are closely situated to each other at intervals of the predetermined distance or less, the metal pattern may be formed of a single metal line.

Metal patterns 320-1 and 320-2 of the second metal layer (Mb) may be located at an inner side of the metal patterns 310-1 and 310-2 of the first metal layer (Ma) in a manner that the metal pattern 320-1 may be spaced apart from the other metal pattern 320-2 by a second distance (d2). In the context of this patent document, the term "inner side" of the metal patterns 310-1 and 310-2 of the first metal layer (Ma) may be used to indicate a region between virtual straight lines parallel to a center line CL and passing through each of the metal patterns 310-1 and 310-2. The center line CL passes through a center position of the photoelectric conversion element 302. In some implementations, the second distance (d2) may be less than the first distance (d1).

Metal patterns 330-1 and 330-2 of the third metal layer (Mc) may be disposed at the inner side of the metal patterns 320-1 and 320-2 of the second metal layer (Mb) in a manner that the metal pattern 330-1 can be spaced apart from the other metal patter 330-2 by a third distance (d3). The third distance (d3) may be less than the second distance (d2).

A metal pattern 340-1 of the fourth metal layer (Md) may be disposed at the inner side of the metal patterns 330-1 and 330-2 of the third metal layer (Mc). Although FIG. 3 illustrates only one metal pattern 340-1 of the fourth metal layer (Md) is disposed within the inner side of the metal patterns 330-1 and 330-2 for convenience of description, it should be noted that a plurality of metal patterns of the fourth metal layer (Md) can be disposed within the inner side of the metal patterns 330-1 and 330-2.

Silicon and some semiconductor materials are known to absorb light at different wavelengths at different levels. In general, the light penetration depths in silicon increase with the wavelength of light. Specifically, the penetration depths of light in the infrared spectral range of 800 nm and longer wavelengths are larger than those of the visible light in the spectral range from 400 nm to 700 nm. A portion of incident infrared (IR) light is absorbed into the photoelectric conversion element 302 disposed in the substrate 301 at a very small thickness from the sensor input surface but, a photoelectric conversion rate (i.e., photoelectric conversion efficiency) of the infrared light is relatively low. This drawback can be compensated by increasing a thickness of the substrate 301 to increase such photoelectric conversion efficiency of the infrared light by placing IR-sensing photoelectric conversion element 302 in the thick substrate 301 further away from the sensor input surface or the lens array. However, such an increase in the thickness of the substrate 301 can lead to an increase in the volume of image sensor devices.

In some embodiments of the disclosed technology, the metal patterns contained in the first to fourth metal layers (Ma-Md) disposed below the substrate 301 of the BSI (back side illumination)-based image sensor 100 may be formed in a concave shape or a parabolic dish shape such that reflected light from the concave surfaces of such metal layers converges or is focused at a certain degree toward the photoelectric conversion element 302. In other words, the metal patterns may be formed in a concave shape such that its concave surface of the concave shape faces the photoelectric conversion element 302. That is, metal patterns of a specific metal layer starting from the substrate 301 within the region corresponding to the unit pixel 200 may be spaced apart from each other by a shorter distance at the inner side of metal patterns (or at the spacing between metal patterns) of another metal layer located closer to the substrate 301. In contrast, metal patterns of a specific metal layer starting from the substrate 301 within the region corresponding to the unit pixel 200 may be configured in a manner that metal patterns of another metal layer located farther from the substrate 301 are disposed at the inner side of the metal patterns (or at the spacing between the metal patterns) and are spaced apart from each other by a longer distance. That is, the distance between the metal patterns may be gradually reduced in proportion to a separation distance from the substrate 301, such that metal patterns contained in the first to fourth metal layers (Ma-Md) in aggregate may be formed in a concave shape surface such that reflected light is directed by the concave shape surface to converge toward the photoelectric conversion element 302. Although the concave shape of such metal patterns may be a horn shape sharpened in a downward direction as shown in FIG. 3 for convenience of description, it should be noted that the concave shape may also be implemented as a concave mirror shape having a specific curvature.

In some implementations, the metal patterns may be arranged below the photoelectric conversion elements to reflect light that reaches the metal patterns toward the photoelectric conversion elements. The metal patterns may be arranged at different distances from the photoelectric conversion elements to form in aggregate a parabolic shaped mirror such that the concave surface of the mirror faces the photoelectric conversion elements.

Each metal pattern may be formed of a metal material (e.g., silver (Ag), aluminum (Al), copper (Cu), etc.) having higher light reflectivity and higher electrical conductivity. That is, since metal patterns contained in the first to fourth metal layers (Ma-Md) are formed of materials having higher light reflectivity, the metal patterns may be formed in a concave shape such that reflected light by such concaved metal patterns facing the photoelectric conversion element 302 converges or is focused at a certain degree toward the photoelectric conversion element 302 and the concave surface of the concave shape faces the photoelectric conversion element 302. In this way, the metal patterns can allow infrared light that has penetrated the photoelectric conversion element 302 without being absorbed by the photoelectric conversion element 302, to be reflected back to the photoelectric conversion element 302. The reflected infrared light may be directly reflected or may be reflected by other structures (e.g., other metal patterns or device isolation films), such that the reflected infrared light can be redirected to the photoelectric conversion element 302. As a result, the number of optical paths for such redirected infrared light may be increased, such that the photoelectric conversion element 302 can more effectively absorb infrared light having a relatively longer wavelength.

In some implementations, the metal patterns contained in the first to fourth metal layers (Ma-Md) can be used to operate the unit pixel 200. By arranging the metal patterns based on some embodiments of the disclosed technology, therefore, the metal patterns for operating the unit pixel 200 (e.g., interconnect for carrying electrical signal generated by the unit pixel 200) can also be used as a mirror for reflecting infrared light toward the unit pixel 200. In addition, the performance of image sensor pixels for detecting the infrared light can be improved by arranging other structures adjacent to the unit pixel 200 without inserting additional reflection structures.

A spacing between neighboring metal lines contained in each metal pattern based on some embodiments of the disclosed technology can be implemented according to a wavelength band of light intended to be reflected. In some implementations, such neighboring metal lines in the structure that is structured to reflect light at infrared (or near infrared NIR) wavelengths are spaced apart from each other by a predetermined distance of 800 nm to 1000 nm. Unlike the unit pixel 200, the spacing between neighboring metal lines in the structure structured to reflect light at wavelengths other than infrared wavelengths may be adjusted. For example, the spacing between neighboring metal lines in the structure structured to reflect light at visible-light wavelengths may be selected from the range of about 400 nm to 750 nm according to target colors.

Referring to FIG. 3, although metal patterns contained in the first to fourth metal layers (Ma-Md) can be symmetrically arranged with respect to the center line (CL) passing through a center point of the unit pixel 200, the center point of metal patterns contained in each of the first to fourth metal layers (Ma-Md) based on another embodiment of the disclosed technology can be arranged at one side (e.g., the left side or right side) with respect to the above center line (CL), such that light reflectivity efficiency caused by metal patterns in the edge region of the pixel array 110 in which a chief ray incident upon the unit pixel 200 has a specific incident angle can be increased. For example, assuming that the chief ray has a constant incident angle from the right side of the center line (CL) as shown in FIG. 3, the center point of metal patterns contained in each of the first to fourth metal layers (Ma-Md) may be arranged at the left side with respect to the center line (CL).

Although illustrates the first to fourth metal layers (Ma-Md) only as an example for convenience of description, the metal layers arranged to form a concave shape facing the photoelectric conversion element 302 can be implemented as follows. The first to n-th (where n is an integer equal to or greater than 2) metal layers may be arranged by sequentially stacking multiple layers on top of one another below the substrate 301, and the spacing between metal patterns contained in the k-th metal layer (where k is an integer selected from 1 to n−1) relative to the substrate surface and the photoelectric conversion element 302 may be larger than the spacing between metal patterns contained in the l-th metal layer (where l is an integer greater than k) which is further away from the substrate surface and the photoelectric conversion element 302 than the closer k-th metal layer. In addition, metal patterns contained in the l-th metal layer may be disposed at the inner side of metal patterns contained in the k-th metal layer.

Figure 4:
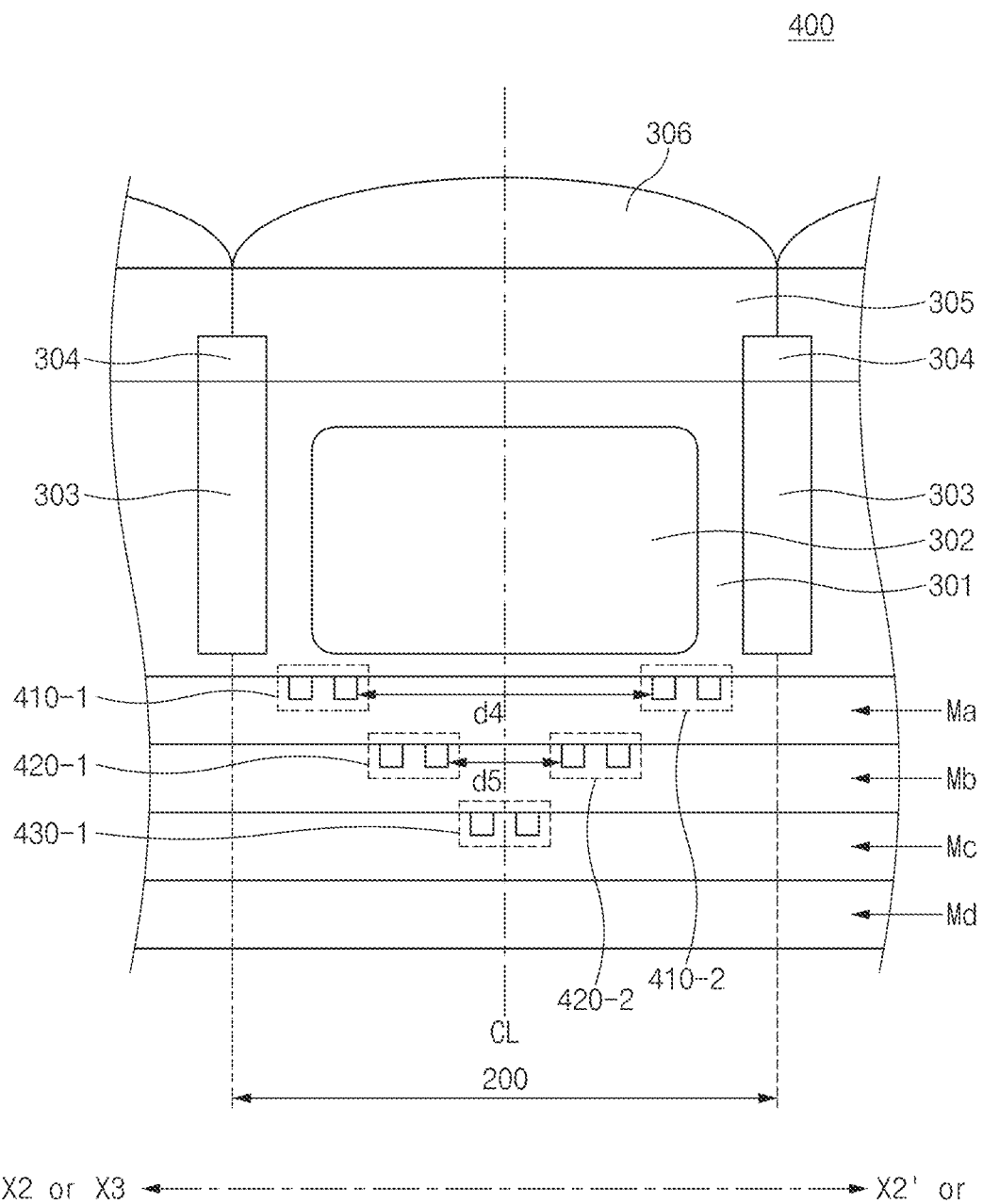
FIG. 4 is a cross-sectional view illustrating another example of the unit pixel shown in FIG. 2.

FIG. 4 is a cross-sectional view illustrating another example of the unit pixel 200 shown in FIG. 2.

In some implementations, assuming that the center region of the unit pixel 200 has a cross-sectional view 300 shown in FIG. 3, the cross-sectional view 400 shown in FIG. 4 may be a cross-sectional view illustrating the unit pixel 200 taken along the second cutting line X2-X2' or the third cutting line X3-X3' shown in FIG. 2.

The cross-sectional view 400 of the unit pixel 200 may include a substrate 301, a photoelectric conversion element 302, a device isolation film 303, a grid region 304, an optical filter 305, a microlens 306, and first to fourth metal layers (Ma-Md). In this case, the remaining constituent elements other than the first to fourth metal layers (Ma-Md) shown in FIG. 4 may be substantially identical in structure to those of FIG. 3.

Metal patterns 410-1 and 410-2 of the first metal layer (Ma) may be disposed at both sides of the unit pixel 200 in a manner that the metal pattern 410-1 is spaced apart from the other metal pattern 410-2 by a fourth distance (d4). The fourth distance (d4) shown in FIG. 4 may be shorter than the first distance (d1) shown in FIG. 3. That is, the spacing between metal patterns contained in the first metal layer (Ma) may be gradually reduced in the direction from the center point of the unit pixel 200 to the edge region of the unit pixel 200.

Metal patterns 420-1 and 420-2 of the second metal layer (Mb) may be disposed at the inner side of the metal patterns 410-1 and 410-2 of the first metal layer (Ma) in a manner that the metal pattern 420-1 can be spaced apart from the other metal pattern 420-2 by a fifth distance (d5). The fifth distance (d5) may be less than the fourth distance (d4). In addition, the fifth distance (d5) may be less than the second distance (d2) shown in FIG. 3. That is, the spacing between metal patterns contained in the second metal layer (Mb) may be gradually reduced in the direction from the center point of the unit pixel 200 to the edge region of the unit pixel 200.

A metal pattern 430-1 of the third metal layer (Mc) may be disposed at the inner side of the metal patterns 420-1 and 420-2 of the second metal layer (Mb).

That is, the spacing between metal patterns contained in each metal layer may be gradually reduced in the direction from the center point of the unit pixel 200 to the edge region, and a metal layer in which the lowermost metal pattern is located may move upward. Due to the above-mentioned structure, the cross-sectional view illustrating the unit pixel taken along the cutting line perpendicular to the first cutting line X1-X1' may have a structure corresponding to the cross-sectional view illustrating the unit pixel taken along the first cutting line X1-X1', and the cross-sectional view illustrating the unit pixel taken along the cutting line perpendicular to the second or third cutting line X2-X2' or X3-X3' may have a structure corresponding to the cross-sectional view illustrating the unit pixel taken along the second or third cutting line X2-X2' or X3-X3'. Therefore, metal patterns contained in the first to fourth metal layers (Ma-Md) in the cross-sectional view acquired from an arbitrary cutting line that passes through the center point of the unit pixel 200 may be formed in a concave shape to reflect light to converge toward the photoelectric conversion element 302.

In some embodiments of the disclosed technology, assuming that the center point of the metal patterns contained in each of the first to fourth metal patterns (Ma-Md) is disposed at one side (e.g., the left side or right side) with respect to the center line (CL) as shown in FIG. 3, the center point of metal patterns contained in each of the first to fourth metal layers (Ma-Md) shown in FIG. 4 can also be disposed at the same side (i.e., the left side or right side) as in FIG. 3 with respect to the center line (CL).

In some embodiments of the disclosed technology, the cross-sectional view of the edge region of the unit pixel 200 may also be identical to the cross-sectional view 300 shown in FIG. 3 in a different way from FIG. 4.

Figure 5:
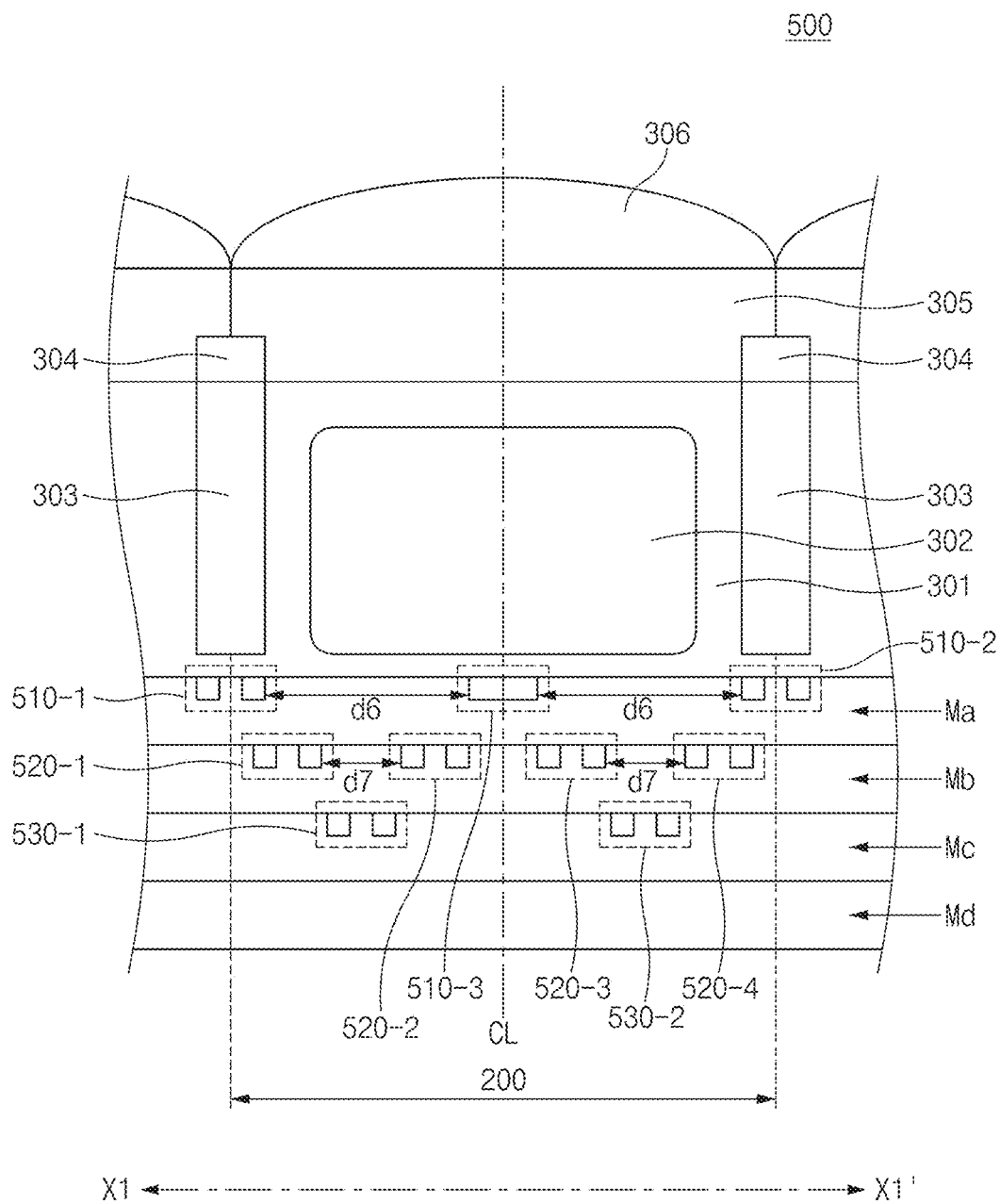
FIG. 5 is a cross-sectional view illustrating another example of the unit pixel shown in FIG. 2.

FIG. 5 is a cross-sectional view illustrating another example of the unit pixel 200 shown in FIG. 2.

In some implementations, the cross-sectional view 500 of the unit pixel 200 may be a cross-sectional view illustrating the unit pixel 200 taken along the first cutting line X1-X1' shown in FIG. 2.

The cross-sectional view 500 of the unit pixel 200 may include a substrate 301, a photoelectric conversion element 302, a device isolation film 303, a grid region 304, an optical filter 305, a microlens 306, and first to fourth metal layers (Ma-Md). In this case, the remaining constituent elements other than the first to fourth metal layers (Ma-Md) shown in FIG. 5 may be substantially identical in structure to those of FIG. 3, and as such redundant description thereof will herein be omitted for brevity.

Metal patterns 510-1 and 510-2 of the first metal layer (Ma) may be disposed at both sides of the unit pixel 200. In addition, a metal pattern 510-3 may be disposed between the metal patterns 510-1 and 510-2 in a manner that the metal pattern 510-3 can be spaced apart from each of the metal patterns 510-1 and 510-2 by a sixth distance (d6). Although the metal pattern 510-3 shown in FIG. 5 is spaced apart from each of the metal pattern 510-1 and the other metal pattern 510-2 by a sixth distance (d6) for convenience of description, the scope or spirit of the disclosed technology is not limited thereto, and the spacing between the metal pattern 510-3 and each of the metal patterns 510-1 and 510-2 may be changed according to some implementations.

Although the metal pattern 510-3 includes a plurality of metal lines in the same manner as in other metal patterns, the metal pattern 510-3 may also include metal lines each having a relatively large width as necessary. The metal pattern 510-3 composed of such metal lines each having a relatively large width may be disposed at the center part of the unit pixel 200 (i.e., may be disposed to overlap with the center line CL) at which incident light penetrating the photoelectric conversion element 302 is concentrated, such that the incident light can be effectively reflected onto the photoelectric conversion element 302. The metal pattern 510-3 may hereinafter be referred to as a central reflection pattern.

Metal patterns 520-1 and 520-2 of the second metal layer (Mb) may be disposed at the inner side of the metal patterns 510-1 and 510-3 of the first metal layer (Ma) in a manner that the metal pattern 520-1 is spaced apart from the other metal pattern 520-2 by a seventh distance (d7). In addition, metal patterns 520-3 and 520-4 of the second metal layer (Mb) may be disposed at the inner side of the metal patterns 510-2 and 510-3 of the first metal layer (Ma) in a manner that the metal pattern 520-3 is spaced apart from the other metal pattern 520-4 by a seventh distance (d7). The seventh distance (d7) may be less than the sixth distance (d6). Although each of the spacing between the metal patterns 520-1 and 520-2 and the spacing between the metal patterns 520-3 and 520-4 is identical to the seventh distance (d7) as shown in FIG. 5, the scope or spirit of the disclosed technology is not limited thereto, and each of the spacing between the metal patterns 520-1 and 520-2 and the spacing between the metal patterns 520-3 and 520-4 may be changed according to some implementations.

A metal pattern 530-1 of the third metal layer (Mc) may be disposed at the inner side of the metal patterns 520-1 and 520-2 of the second metal layer (Mb), and a metal pattern 530-2 of the third metal layer (Mc) may be disposed at the inner side of the metal patterns 520-3 and 520-4 of the second metal layer (Mb).

Metal patterns contained in the first to third metal layers (Ma-Mc) disposed below the substrate 301 of the BSI image sensor 100 may be formed in a concave shape that is concave in the direction from both sides (i.e., left and right sides) to the photoelectric conversion element 302 with respect to the center line (CL). That is, metal patterns of a specific metal layer starting from the substrate 301 within the right or left region of the unit pixel 200 may be spaced apart from each other by a shorter distance at the inner side of metal patterns (or at the spacing between metal patterns) of another metal layer located closer to the substrate 301. In contrast, metal patterns of a specific metal layer starting from the substrate 301 within the right or left region of the unit pixel 200 may be configured in a manner that metal patterns of another metal layer located farther from the substrate 301 may be disposed at the inner side of the metal patterns (or at the spacing between the metal patterns) and may be spaced apart from each other by a longer distance. That is, the distance between the metal patterns may be gradually reduced in proportion to a separation distance from the substrate 301, such that metal patterns contained in the first to third metal layers (Ma-Mc) may be formed in an overall concave shape that is concave toward the photoelectric conversion element 302. In this case, although the concave shape of such metal patterns may be a horn shape sharpened in a downward direction as shown in FIG. 5, it should be noted that the concave shape may also be a concave mirror shape having a specific curvature. In addition, although the metal patterns contained in the first to third metal layers (Ma-Mc) shown in FIG. 5 are formed in a concave shape for convenience of description,—metal patterns contained in two, four, or more metal layers may be formed in a concave shape in the same manner as in the first and second metal layers (Ma-Mb) or as in the first to fourth metal layers (Ma-Md).

The metal patterns contained in the first to third metal layers (Ma-Mc) may be formed of materials having higher light reflectivity and may be formed in a concave shape that is concave toward the photoelectric conversion element 302, such that the metal patterns can allow infrared (IR) light that has been incident upon the photoelectric conversion element 302 and has penetrated the photoelectric conversion element 302 without being absorbed by the photoelectric conversion element 302, to be reflected again in the direction of the photoelectric conversion element 302. The reflected infrared (IR) light may be directly reflected or may be reflected by other structures (e.g., other metal patterns or device isolation films), such that the reflected infrared (IR) light can be re-incident upon the photoelectric conversion element 302. As a result, the number of optical paths of such re-incident infrared (IR) light may be increased, such that the photoelectric conversion element 302 can more effectively absorb infrared (IR) light having a relatively longer wavelength.

Although the above-mentioned embodiment of the disclosed technology has exemplarily disclosed only the cross-sectional view 500 illustrating the unit pixel 200 taken along the first cutting line X1-X1' shown in FIG. 2 for convenience of description, the scope or spirit of the disclosed technology is not limited thereto, and the cross-sectional view illustrating the unit pixel 200 taken along the second or third cutting line X2-X2' or X3-X3' shown in FIG. 2 may be substantially identical to the cross-sectional view 500. In accordance with another embodiment, metal patterns can also be disposed in a manner that a concave region of the metal patterns may be gradually reduced in the direction from the center point of the unit pixel 200 to the edge region of the unit pixel 200 as shown in FIG. 4.

Figure 6:
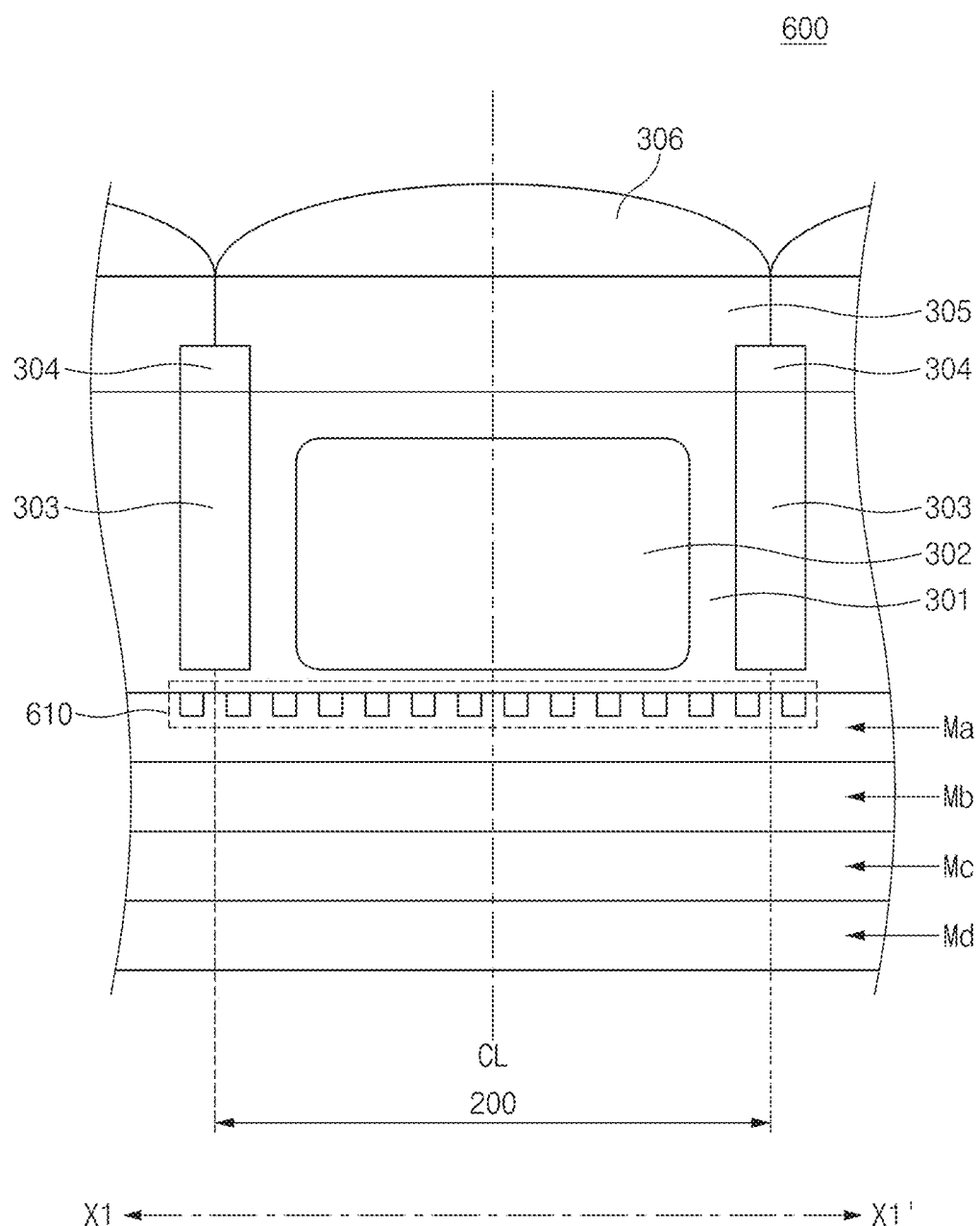
FIG. 6 is a cross-sectional view illustrating still another example of the unit pixel shown in FIG. 2.

FIG. 6 is a cross-sectional view illustrating still another example of the unit pixel 200 shown in FIG. 2.

In some implementations, the cross-sectional view 600 of the unit pixel 200 may be a cross-sectional view illustrating the unit pixel 200 taken along the first cutting line X1-X1' shown in FIG. 2.

The cross-sectional view 600 of the unit pixel 200 may include a substrate 301, a photoelectric conversion element 302, a device isolation film 303, a grid region 304, an optical filter 305, a microlens 306, and first to fourth metal layers (Ma-Md). In this case, the remaining constituent elements other than the first to fourth metal layers (Ma-Md) shown in FIG. 4 may be substantially identical in structure to those of FIG. 3.

A metal pattern 610 of the first metal layer (Ma) may include a plurality of metal lines disposed to overall cover a lower portion of the photoelectric conversion element 302. A spacing between contiguous metal lines from among several metal lines can be implemented according to a wavelength band of light intended to be reflected. In some implementations, the contiguous metal lines structured to reflect light at infrared (or near infrared NIR) wavelengths are spaced apart from each other by a predetermined distance of about 800 nm to 1000 nm. Unlike the unit pixel 200, a spacing between contiguous metal lines structured to reflect light at wavelengths other than infrared wavelengths may be adjusted. For example, the spacing between contiguous metal lines structured to reflect light at visible-light wavelengths may be selected from the range of about 400 nm to 750 nm according to target colors.

The metal pattern 610 of the first metal layer (Ma) may include a plurality of metal lines disposed to cover the lower portion of the photoelectric conversion element 302 as shown in FIG. 6, such that the leakage amount of incident light having penetrated the photoelectric conversion element 302 can be minimized and at the same time the incident light can also be reflected in the direction of the photoelectric conversion element 302.

Although each of the second to fourth metal layers (Mb-Md) shown in FIG. 6 does not include metal patterns for convenience of description, other metal patterns for operating the unit pixel 200 can also be additionally disposed in the second to fourth metal layers (Mb-Md).

As is apparent from the above description, the image sensor based on some implementations of the disclosed technology includes a reflection structure for allowing infrared (IR) light having penetrated photoelectric conversion elements to be reflected back to the photoelectric conversion elements, thereby improving the IR-light absorption rate.

Although a number of illustrative embodiments consistent with the disclosed technology have been described, it should be understood that numerous other modifications and embodiments can be devised based on this disclosure. Particularly, numerous variations and modifications are possible in the component parts and/or arrangements.

What is claimed is:

1. An image sensor comprising:
a substrate including one or more photoelectric conversion elements arranged in the substrate and structured to convert light into electrical signals representing an image carried by the light; and
a plurality of metal layers arranged at different distances from a surface of the sub state and located below the one or more photoelectric conversion elements, each of the metal layers including one or more metal patterns,
wherein the one or more metal patterns of the plurality of metal layers are arranged in a concave shape facing one of the photoelectric conversion elements such that incident light reflected by metal layers converges toward the one of the photoelectric conversion elements,
wherein the one or more metal patterns forming the concave shape are arranged independently of the one or more photoelectric conversion elements.

2. The image sensor according to claim 1, wherein the plurality of metal layers include a first metal layer and a second metal layer, and wherein:
a first distance between metal patterns contained in the first metal layer is larger than a second distance between metal patterns contained in the second metal layer disposed below the first metal layer.

3. The image sensor according to claim 2, wherein the metal patterns contained in the second metal layer are disposed in a region between virtual straight lines parallel to a center line and passing through each of the metal patterns contained in the first metal layer, and
wherein the center line passes through a center position of the photoelectric conversion element.

4. The image sensor according to claim 2, wherein the plurality of metal layers further include a third metal layer, and wherein the second distance is larger than a third distance between metal patterns contained in the third metal layer disposed below the second metal layer.

5. The image sensor according to claim 4, wherein the metal patterns contained in the third metal layer are disposed in a region between virtual straight lines parallel to a center line and passing through each of the metal patterns contained in the second metal layer, and
wherein the center line passes through a center position of the photoelectric conversion element.

6. The image sensor according to claim 2, wherein:
a distance between adjacent metal patterns contained in the first metal layer gradually decreases as the metal patterns get closer to an edge region of each unit pixel that includes each photoelectric conversion element.

7. The image sensor according to claim 2, wherein:
a distance between adjacent metal patterns contained in the second metal layer gradually decreases as the metal patterns get closer to an edge region of each unit pixel that includes each photoelectric conversion element.

8. The image sensor according to claim 2, wherein the first metal layer further includes:
a central reflection pattern disposed to overlap with a center line passing through a center position of the photoelectric conversion element.

9. The image sensor according to claim 8, wherein:
a fourth distance between the central reflection pattern and each metal pattern of the first metal layer disposed at one side of the center line is larger than a fifth distance between the metal patterns of the second metal layer disposed at the one side of the center line.

10. The image sensor according to claim 9, wherein the metal patterns of the second metal layer disposed at the one side of the center line are disposed at an inner side of the central reflection pattern and each metal pattern of the first metal layer disposed at the one side of the center line.

11. The image sensor according to claim 8, wherein:
a sixth distance between the central reflection pattern and each metal pattern of the first metal layer disposed at the other side of the center line is larger than a seventh distance between the metal patterns of the second metal layer disposed the other side of the center line.

12. The image sensor according to claim 11, wherein the metal patterns of the second metal layer disposed at the other side of the center line are disposed at an inner side of the central reflection pattern and each metal pattern of the first metal layer disposed at the other side of the center line.

13. The image sensor according to claim 2, wherein:
at least one metal pattern from among the metal patterns contained in the first metal layer is disposed below a device isolation film formed to prevent optical crosstalk.

14. An image sensor comprising:
a photoelectric conversion element arranged in a substrate; and
two or more metal layers arranged at different distances from the photoelectric conversion element,
wherein a distance between metal patterns contained in a first metal layer is larger than a distance between metal patterns contained in a second metal layer located further away from the photoelectric conversion element than the first metal layer,
wherein the image sensor is structured to receive incident light to reach the photoelectric conversion element first and then to reach to the two or more metal layers,
wherein the metal patterns contained in the two or more metal layers are formed to have a concave shape surface facing the photoelectric conversion element to converge reflected light by the metal layers toward the photoelectric conversion element,
wherein the metal patterns forming the concave shape surface are arranged independently of the photoelectric conversion element.

15. The image sensor according to claim 14, wherein the image sensor is structured as a back side illumination CMOS sensor.

16. An image sensor comprising:
a substrate;
one or more photoelectric conversion elements arranged in the substrate; and
one or more optically reflective elements arranged below the one or more photoelectric conversion elements to reflect light that reaches the one or more optically reflective elements through the one or more photoelectric conversion elements toward the one or more photoelectric conversion elements,
wherein each of the one or more optically reflective elements includes a plurality of metal layers arranged at different distances from a surface of the substrate to form in aggregate a concave shaped reflector facing the one or more photoelectric conversion elements, wherein the metal layers forming the concave shaped reflector are arranged independently of the one or more photoelectric conversion elements.

17. The image sensor according to claim 16, wherein a focal point of the concave shaped reflector is placed toward a photoelectric conversion element.

* * * * *